United States Patent [19]

Tashiro

[11] Patent Number: 5,042,147
[45] Date of Patent: Aug. 27, 1991

[54] METHOD OF PREPARING SURFACE-MOUNTED WIRING BOARD

[75] Inventor: Harumi Tashiro, Mizuhomachi, Japan

[73] Assignee: Kabushiki Kaisha Toshiba, Kawasaki, Japan

[21] Appl. No.: 524,388

[22] Filed: May 17, 1990

[30] Foreign Application Priority Data

May 22, 1989 [JP] Japan .................................. 1-128038

[51] Int. Cl.$^5$ ............................................. H05K 3/02
[52] U.S. Cl. ...................................... 29/847; 29/846; 228/180.2; 357/80; 361/409
[58] Field of Search .............................. 437/182, 220; 228/180.2; 29/846, 847, 840; 357/80, 74

[56] References Cited

U.S. PATENT DOCUMENTS

| | | | |
|---|---|---|---|
| 3,325,882 | 6/1967 | Chiou et al. | 29/846 X |
| 3,614,832 | 10/1971 | Chance et al. | 29/846 X |
| 3,781,596 | 12/1973 | Galli et al. | 361/409 X |
| 3,821,847 | 7/1974 | Melse et al. | 29/846 X |
| 3,838,984 | 10/1974 | Crane et al. | 228/180.2 X |
| 3,996,603 | 12/1976 | Smith | 357/80 |

Primary Examiner—Carl J. Arbes
Attorney, Agent, or Firm—Foley & Lardner

[57] ABSTRACT

A method of preparing a surface-mounted wiring board according to the present invention includes forming a plurality of die pads and bonding pads, which are composed of Cu or Ni and arranged at predetermined areas of a wiring board. Electrical connections are formed between the die pads and between the die pad and the bonding pads. An Au-plated coating on each of the formed pad surfaces is formed by electroplating. The Au-electroplated pad surfaces are isolated from each other by selectively cutting away part of a predetermined area on the wiring board to separate the conductors electrically interconnecting the pads.

When both the die pad for arranging and mounting an electronic component and the bonding pads for connecting the arranged and mounted electronic component to the signal lines (wiring pattern) are Au-electroplated to coat them, one conductor terminal for plating is shared among the die pad and the bonding pads.

3 Claims, 1 Drawing Sheet

FIG. I
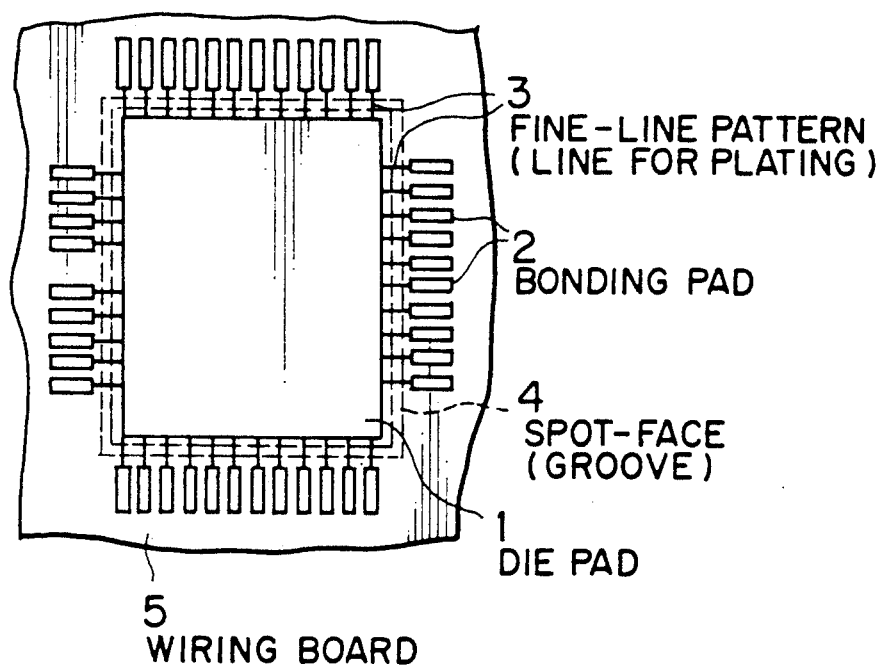
FIG. 2
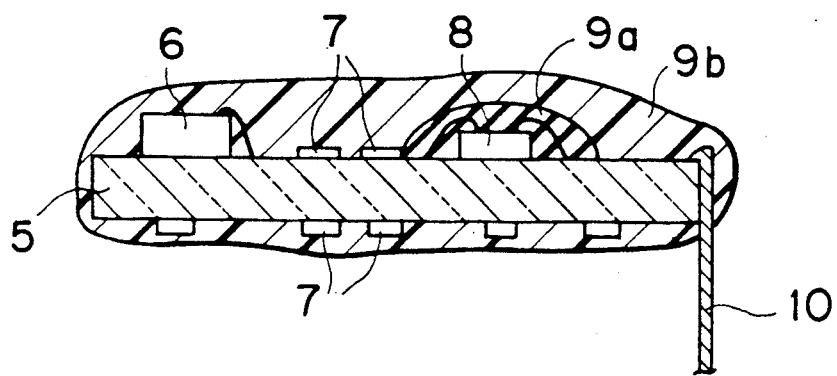

METHOD OF PREPARING SURFACE-MOUNTED WIRING BOARD

BACKGROUND OF THE INVENTION

1. Field of the Invention

This invention relates to a method of preparing a surface-mounted wiring board, and more particularly to a method of preparing a surface-mounted wiring board in which a process of coating die pads and bonding pads by Au-plating is modified.

2. Description of the Related Art

A hybrid circuit (device) formed by arranging and mounting electronic components such as SOP-LSIs (Small Outline Package Large Scale Integrated circuit), QFP-LSIs (Quad Flat Package Large Scale Integrated circuit), LSI chips, bare chips, IC (Integrated Circuit) chips, chip capacitors, and chip resistors on one face or both faces of a wiring board such as a multilayer wiring board has been widely applied to various types of electronic devices.

In such a hybrid circuit (device), each of the electronic components is arranged and mounted on a die pad section metallized at a predetermined area of the wiring board and is electrically connected as prescribed to a bonding pad section arranged around the die pad section by, e.g., wire bonding. More specifically, the die pad and bonding pad surfaces made of Cu or Ni are further provided with an Au-plated coating to stabilize them. On the die pad section thus processed, an electronic component is arranged and mounted by means of a reflow soldering process using, e.g., a cream solder. To the bonding pad section, the input/output (I/O) terminals of the electronic component, e.g., an IC chip, are electrically interconnected by a bonding wire. A hybrid circuit having predetermined electronic components arranged and mounted will thus be prepared.

By the way, a surface-mounted wiring board is generally fabricated as follows. A die pad or die pads and the corresponding bonding pads are formed, together with a circuit pattern for signal lines, at predetermined areas on one face or both faces of the wiring board by, e.g., selectively etching a copper foil layer. During this selective etching process, the conductor terminals (conductor lines for plating) for these die pads and bonding pads must be formed by drawing out to the periphery of the wiring board in preparation for Au-electroplating, which is a subsequent process. After the Au-electroplating process has been effected as prescribed with these conductor terminals as the plating terminals, a surface-mounted wiring board can be obtained.

However, the above-described method has the following shortcomings. In order to Au-electroplate these die pads and bonding pads, their conductor terminals must be drawn out to the periphery of the wiring board. This means that two kinds of line, a conductor line for plating and a signal line, must coexist on the wiring board surface, thereby decreasing the wiring density of signal line. Particularly, in cases where the number of electronic components to be arranged and mounted on the wiring board is large and the number of leads of an electronic component is large as well, numerous pads must be prepared. Consequently, the area of the conductor terminals required for Au-electroplating will naturally be increased, thereby affecting the mounting density of the wiring board.

It is therefore an object of the present invention to remove this restriction imposed on the wiring density and thereby to provide a method of preparing a surface-mounted board adapted for easily constructing a high density hybrid circuit.

It is another object of the present invention to provide a method of preparing a surface-mounted board adapted for easily constructing a highly reliable hybrid circuit.

SUMMARY OF THE INVENTION

A method of preparing a surface-mounted wiring board according to the present invention comprises the steps of: forming a plurality of die pads and bonding pads, which are composed of Cu or Ni and arranged at predetermined areas of a wiring board, being electrically connected between the die pads and between the die pad and the bonding pads; forming an Au-plated coating on each of the formed pad surfaces by electroplating; and electrically isolating the Au-electroplated pad surfaces from each other by selectively cutting away part of a predetermined area on the wiring board thereby to separate the conductors electrically interconnecting the pads. More specifically, a plurality of die pads and bonding pads, formed at predetermined areas of the wiring board, are electrically connected to each other between the die pads and between the die pad and the bonding pads by a fine-line wiring pattern in advance; an Au-electroplated coating is then formed on each pad using a single conductor terminal for plating; and the fine-line wiring pattern is thereafter cut away to electrically isolate the pads from each other.

According to the present invention, the Au-electroplating to the die pads and bonding pads that are formed on the predetermined areas of the wiring board is effected using only one conductor terminal for plating. That is, the conductor terminal is not arranged for each die pad and each bonding pad but one conductor terminal is shared by a group of pads, thereby significantly reducing the area to be occupied by the conductor terminal for plating.

Therefore, the restriction affecting the arrangement of the wiring pattern (signal lines) may also be so appreciably reduced that not only the wiring density can be improved but also the size of the surface-mounted wiring board can easily be made smaller. Further, since a surface area large enough to arrange and mount the electronic components can be provided, the mounting density can be improved or the hybrid circuit itself can be made smaller. The easy and proper Au-electroplating operation is also an advantage.

Moreover, after the Au-electroplating, the die pads and bonding pads are separated from each other (insulated) by cutting away the fine-line pattern electrically interconnecting them. This allows the hybrid circuit (device) constructed by arranging and mounting a predetermined set of electronic components to be trouble-free and thus to maintain high reliability.

BRIEF DESCRIPTION OF THE DRAWINGS

FIG. 1 is a plan view schematically showing the state of electrically isolating a die pad from bonding pads after subjecting the die pad and the boding pads to an Au-electroplating process in the method of the present invention; and FIG. 2 is a sectional view showing an example of a hybrid circuit arranged by using a surface-mounted wiring board according to the present invention.

DETAILED DESCRIPTION OF THE PREFERRED EMBODIMENT

An embodiment of the present invention will be described with reference to the accompanying drawings.

A multilayer wiring board having internal layer circuit patterns and formed by bonding a copper foil layer on both faces is prepared. By subjecting the copper foil layers arranged on both faces to a predetermined selective etching process and the like, a die pad, a bonding pad, and the like are arranged at predetermined areas of the board.

More specifically, in the case where such an electronic component as an SOP-LSI, a QFP-LSI, a chip capacitor, a chip resistor, or an IC chip is arranged and mounted on the board, an area of about 15 mm in width and about 8 mm in length for arranging a die pad; an area of about 200 $\mu$m in width and about 600 $\mu$m in length being laid out at a pitch of about 300 $\mu$m, corresponding to the I/O terminal of the electronic component, for arranging a die pad; and a fine-line pattern area of about 80 $\mu$m in width for electrically interconnecting the die pad to the bonding pad; and an area for arranging a circuit pattern (signal lines) are subjected to a selective exposure and developing process by means of a photoresist thereby to mask them with a resist.

Thus, after the required masking process has been completed, the die pad, the bonding pads, and the like are formed by being subjected to a selective etching with an alkaline solution; and the masking layer is removed by dissolving using 1,1,1-trichloromethane as a solvent. As a result, a wiring board having the die pad, the bonding pads, the fine-line pattern area for electrically interconnecting the die pad to the bonding pad, and the area for arranging a circuit pattern (signal lines) is obtained.

Thereafter, a conductor terminal for Au-electroplating is not only connected to the die pad and bonding pads that are electrically interconnected to each other on the fine-line pattern area but also immersed into an Au-electroplating solution (composed of gold cyanide), in which a dc voltage of 1 to 2 A/dm$^2$ is applied thereby to coat the surface of the die pad and bonding pads with an Au-electroplated coating of about 0.5 $\mu$m in thickness. After Au-electroplated, the wiring board is selectively cut in the form of a groove whose width is about 1 mm and depth is about 0.5 mm or smaller in an attempt to separate the fine-line pattern that electrically interconnects the die pad and the bonding pads. As a result, the surface-mounted wiring board as desired can be obtained.

FIG. 1 is a plan view showing schematically the surface-mounted wiring board thus prepared. Referring to the figure, reference numeral 1 designates a die pad for an IC chip; 2, a bonding pad; 3, a fine-line pattern (line for plating) interconnecting the die pad 1 for an IC chip and the bonding pads 2; 4, an area in which the surface of the wiring board 5 is spot-faced (grooved) about 1 mm in width to electrically isolate the die pad 1 for an IC chip from the bonding pads by cutting away the fine-line pattern (line for plating).

An example of arranging and mounting electronic components on the surface-mounted wiring board will be described.

A cream solder is coated by printing on the respective die pads on the wiring board; electronic components including an SOP-LSI, a QFP-LSI, a chip capacitor, and a chip resistor are arranged and then subjected to a reflow soldering process. After having mounted, e.g., an IC chip, on the predetermined die pad 1, the wiring board is subjected to a predetermined wire bonding process.

Then, a function test is conducted on a circuit arranged and mounted on the wiring board as prescribed. If the circuit has passed this function test, the wiring board is potted in a precoating resin, further covered with an externally coating resin layer, and heated to harden the resin coating. Then, a function test is conducted again. Accordingly, the desired wiring board is obtained.

FIG. 2 sectionally shows a hybrid circuit (device) constructed by the above method. In the figure, reference numeral 5 designates a multilayer wiring board; 6, an SOP-LSI or a QFP-LSI; 7, a chip capacitor or a chip resistor; 8, an IC chip; 9a, a precoating resin layer; 9b, an externally coating resin layer; and 10, an I/O lead pin.

Although the above example of preparing a surface-mounted wiring board is the case of a double-face mounted multilayer wiring board, the present invention may, of course, be applicable to a single-face multilayer wiring board, a single-face or double-face single layer wiring board. Further, the Au-electroplating may not necessarily have to be applied to both the die pads and the bonding pads, but may be applied to either one of them.

Further, in arranging and mounting the electronic components, if a technique of, e.g., mounting only the IC chip on the main surface is adopted, a reflow soldering process using, e.g., a cream solder can be effected more easily. Still further, if a phenol resin is used as the externally coating resin, an acid solution must be employed to remove by dissolving this externally coating resin. Since the acid solution dissolves also the bonding wire and the like, it is preferable to use the phenol resin from a security standpoint.

As described in the foregoing pages, according to the method of preparing a surface-mounted wiring board of the present invention, when both the die pad for arranging and mounting an electronic component and the bonding pads for connecting the arranged and mounted electronic component to the signal lines (wiring pattern) are Au-electroplated to coat them, one conductor terminal for plating is shared among the die pad and the bonding pads. More specifically, the number of conductor terminals (line for plating) for Au-electroplating can so substantially be reduced that the area on the wiring board occupied by the conductor terminals for plating (line for plating) can also be reduced, thereby providing a larger area for mounting electronic components and contributing to the improvement of the mounting density of the board.

In addition, the conductor terminal for plating (line for plating) shared by the die pad and the bonding pads in Au-electroplating them are cut away upon completion of the electroplating process and the die pad and the bonding pads are electrically separated from each other, thereby leaving no inconveniences to the hybrid circuit thus formed.

What is claimed is:

1. A method of preparing a surface-mounted wiring board comprising the steps of:
    forming a plurality of pads including at least one die pad and at least one bonding pad and electrically interconnecting at least a die pad and a bonding pad, said die pad and bonding pad being composed of Cu or Ni at predetermined surface areas on said wiring board;

forming an Au-plated coating on a surface of each of said die pad and bonding pad by electroplating; and electrically isolating at least some of said die pads and said bonding pads having said Au-plated coating from each other by selectively cutting away part of a predetermined area of said wiring board to separate conductors that interconnect said pads electrically.

2. A method of preparing a surface-mounted wiring board as claimed in claim 1, wherein a said bonding pad corresponds to said die pad and is electrically interconnected to said die pad.

3. A method of preparing a surface-mounted wiring board as claimed in claim 1, wherein a groove is formed at a predetermined area of said wiring board to cut away said conductors that interconnect said pads and thereby to electrically isolate said pads from each other.

* * * * *